(12) United States Patent
Kavalieros et al.

(10) Patent No.: US 10,304,929 B2
(45) Date of Patent: May 28, 2019

(54) TWO-DIMENSIONAL CONDENSATION FOR UNIAXIALLY STRAINED SEMICONDUCTOR FINS

(71) Applicant: Intel Corporation, Santa Clara, CA (US)

(72) Inventors: Jack T. Kavalieros, Portland, OR (US); Nancy Zelick, Portland, OR (US); Been-Yih Jin, Lake Oswego, OR (US); Markus Kuhn, Beaverton, OR (US); Stephen M. Cea, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/650,569

(22) Filed: Jul. 14, 2017

(65) Prior Publication Data

US 2017/0317172 A1    Nov. 2, 2017

Related U.S. Application Data

(60) Continuation of application No. 15/216,649, filed on Jul. 21, 2016, now Pat. No. 9,711,598, which is a (Continued)

(51) Int. Cl.
*H01L 29/10* (2006.01)
*H01L 29/66* (2006.01)
(Continued)

(52) U.S. Cl.
CPC ........ *H01L 29/1054* (2013.01); *H01L 29/161* (2013.01); *H01L 29/165* (2013.01); *H01L 29/66795* (2013.01); *H01L 29/66818* (2013.01); *H01L 29/785* (2013.01); *H01L 29/7842* (2013.01); *H01L 29/7849* (2013.01); *H01L 29/7851* (2013.01); *H01L 29/7854* (2013.01)

(58) Field of Classification Search
None
See application file for complete search history.

(56) References Cited

U.S. PATENT DOCUMENTS

2006/0027870 A1* 2/2006 Inaba ................. H01L 27/1203
                                                                  257/353
2007/0069302 A1* 3/2007 Jin ......................... H01L 21/84
                                                                  257/369

(Continued)

*Primary Examiner* — Matthew L Reames
(74) *Attorney, Agent, or Firm* — Schwabe, Williamson & Wyatt P.C.

(57) ABSTRACT

Techniques are disclosed for enabling multi-sided condensation of semiconductor fins. The techniques can be employed, for instance, in fabricating fin-based transistors. In one example case, a strain layer is provided on a bulk substrate. The strain layer is associated with a critical thickness that is dependent on a component of the strain layer, and the strain layer has a thickness lower than or equal to the critical thickness. A fin is formed in the substrate and strain layer, such that the fin includes a substrate portion and a strain layer portion. The fin is oxidized to condense the strain layer portion of the fin, so that a concentration of the component in the strain layer changes from a pre-condensation concentration to a higher post-condensation concentration, thereby causing the critical thickness to be exceeded.

12 Claims, 7 Drawing Sheets

Related U.S. Application Data continuation of application No. 14/882,440, filed on Oct. 13, 2015, now Pat. No. 9,419,140, which is a continuation of application No. 13/488,238, filed on Jun. 4, 2012, now Pat. No. 9,159,835, which is a division of application No. 12/646,427, filed on Dec. 23, 2009, now Pat. No. 8,211,772.

(51) Int. Cl.
  *H01L 29/78*  (2006.01)
  *H01L 29/165*  (2006.01)
  *H01L 29/161*  (2006.01)

(56) References Cited

U.S. PATENT DOCUMENTS

| | | | | |
|---|---|---|---|---|
| 2008/0014699 | A1* | 1/2008 | Torek | H01L 29/66795 |
| | | | | 438/257 |
| 2009/0017602 | A1* | 1/2009 | Damlencourt | H01L 21/0242 |
| | | | | 438/481 |
| 2009/0267155 | A1* | 10/2009 | Izumida | H01L 29/1054 |
| | | | | 257/365 |

* cited by examiner

TWO-DIMENSIONAL CONDENSATION FOR UNIAXIALLY STRAINED SEMICONDUCTOR FINS

RELATED APPLICATIONS

This application is a Continuation of application Ser. No. 15/216,649 filed Jul. 21, 2016, which is a Continuation of application Ser. No. 14/882,440 filed Oct. 13, 2015 now U.S. Pat. No. 9,419,140 issued Aug. 16, 2016, which is a Continuation of application Ser. No. 13/488,238 filed on Jun. 4, 2012 now U.S. Pat. No. 9,159,835 issued Oct. 13, 2015 which is a Divisional of application Ser. No. 12/646,427 filed on Dec. 23, 2009 now U.S. Pat. No. 8,211,772 issued Jul. 3, 2012 which are hereby incorporated by reference.

BACKGROUND

A FinFET is a transistor built around a thin strip of semiconductor material (generally referred to as the fin). The transistor includes the standard field effect transistor (FET) nodes, including a gate, a gate dielectric, a source region, and a drain region. The conductive channel of the device resides on the outer sides of the fin beneath the gate dielectric. Specifically, current runs along both sidewalls of the fin (sides perpendicular to the substrate surface) as well as along the top of the fin (side parallel to the substrate surface). Because the conductive channel of such configurations essentially resides along the three different outer, planar regions of the fin, such a FinFET design is sometimes referred to as a trigate FinFET. Other types of FinFET configurations are also available, such as so-called double-gate FinFETs, in which the conductive channel principally resides only along the two sidewalls of the fin (and not along the top of the fin).

There are a number of non-trivial issues associated with fabricating FinFETs.

DETAILED DESCRIPTION

Figure 1A:
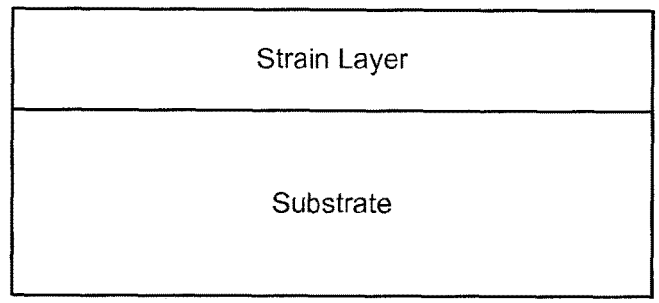
FIGS. 1a through 1c illustrate formation of uniaxially strained fin structures configured in accordance with an embodiment of the present invention.

Techniques are disclosed for enabling multi-sided condensation of semiconductor fins. The techniques allow, for instance, SiGe fins to be grown with Ge concentrations in excess of the critical layer thickness for a particular Ge concentration. This higher Ge content can be used, for example, to enhance hole mobility of the p-type metal oxide semiconductor (PMOS) transistors. In a more general sense, higher concentrations of uniaxially strained material can be achieved on a fin structure of FinFET devices (e.g., trigates).

General Overview

As previously stated, there are a number of non-trivial issues associated with fabricating FinFETs, which effectively limit the applications for which FinFET processing can be employed. For example, silicon germanium (SiGe) fins cannot be grown with germanium concentrations in excess of the critical layer thickness for a particular Ge concentration. In general, higher germanium content enhances the hole mobility of PMOS transistors. While blanket film condensation of SiGe can be used to provide increased surface germanium concentrations, and SiGe based FinFETs have been made on silicon-on-insulator (SOI), the resulting germanium concentrations do not exceed the critical thickness.

In the context of semiconductors, the critical thickness refers to the thickness of a strained layer that can be accommodated on top of a substrate layer, so that the strained layer does not show signs of relaxation. For example, there is a critical thickness associated with a strained layer of SiGe film deposited on a Si substrate. In general, once the SiGe strain layer thickness exceeds this critical thickness, the film continues to grow, but begins to relax by forming islands of growth and/or defects in the crystal. These defects essentially are breaks, shifts or slips in the crystalline lattice of SiGe, such that the order of the atoms is disrupted and in turn relaxes the strain in the film.

Thus, and in accordance with an embodiment of the present invention, a strain layer is grown or otherwise deposited on a substrate to a desired thickness, but at or below the critical thickness. This blanket strain layer is generally subjected to biaxial strain. The strain layer can then be patterned into one or more fins, so as to convert the biaxial strain to uniaxial strain. The patterned strain layer is then oxidized to condense a component of that strain layer. For instance, in one specific example case, a strain layer of SiGe is deposited on a Si substrate. In such a case, the addition of oxygen ($O_2$) or ozone ($O_3$) consumes a percentage of Si from the SiGe strain layer to form $SiO_2$, thereby effectively pushing Ge from the SiGe strain layer into the fin (hence, a condensing of Ge content of the SiGe layer).

In some embodiments, this condensation occurs from both sides of the fin and the top of the fin, simultaneously. In other embodiments, however, the condensation may be tailored such that any one fin surface or combination of fin surfaces using, for example, protective layers selectively deposited to stop or otherwise inhibit oxidation, if so desired. In trigate applications, the net concentration of the component being condensed (e.g., Ge) increases rapidly as the densification occurs from all three exposed sides of the fin, and surpasses the percentage allowed by the initial biaxial film growth.

In addition, the increase in Ge (or other condensed material) results in an increase in strain beyond that achievable via the initial grown blanket film, as the fin patterning allows the fins to relax from biaxial to uniaxial stress. Multi-dimensional condensation as described herein can not only be employed for creation of a uniform distribution of condensed material (such as Ge) within the fin, but can also be tailored to allow for creation of a two-dimensional distribution of condensed material within the fin, such as the case where a higher condensed material content is provided near the surface of the fin (relative to inner portions of the fin) so as to effectively provide a cladding layer of condensed material.

In one example case, multi-sided condensation as described herein is employed in the fabrication of PMOS FinFETs (e.g., trigate) having a SiGe channel, so as to achieve of SiGe fins having a higher Ge concentration, higher uniaxial compressive strain levels in the SiGe channel of the FinFET, and higher mobility of holes of the FinFET device. Numerous other device configurations can benefit from the techniques described herein, as will be appreciated in light of this disclosure.

Fin Structure

Figure 1B:
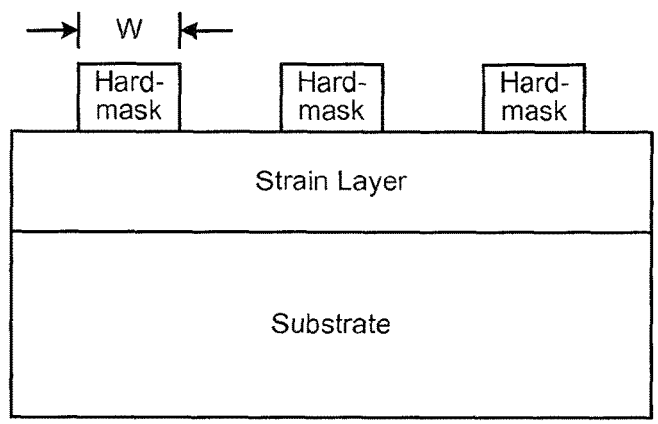
Figure 1C:
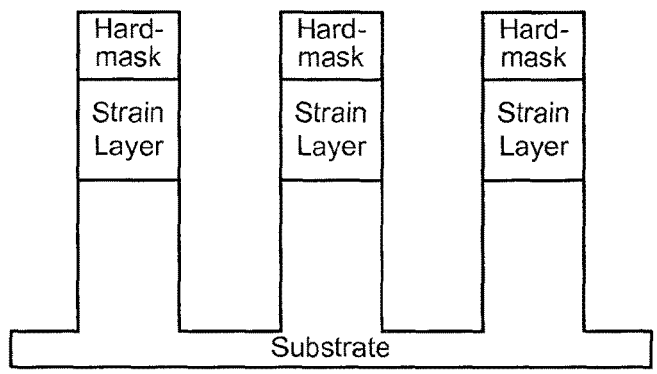

FIGS. 1a through 1c illustrate formation of a uniaxially strained fin structure configured in accordance with an embodiment of the present invention. Each of the views shown is a cross-sectional side view, wherein the cross-section is parallel to the fins.

Figure 2:
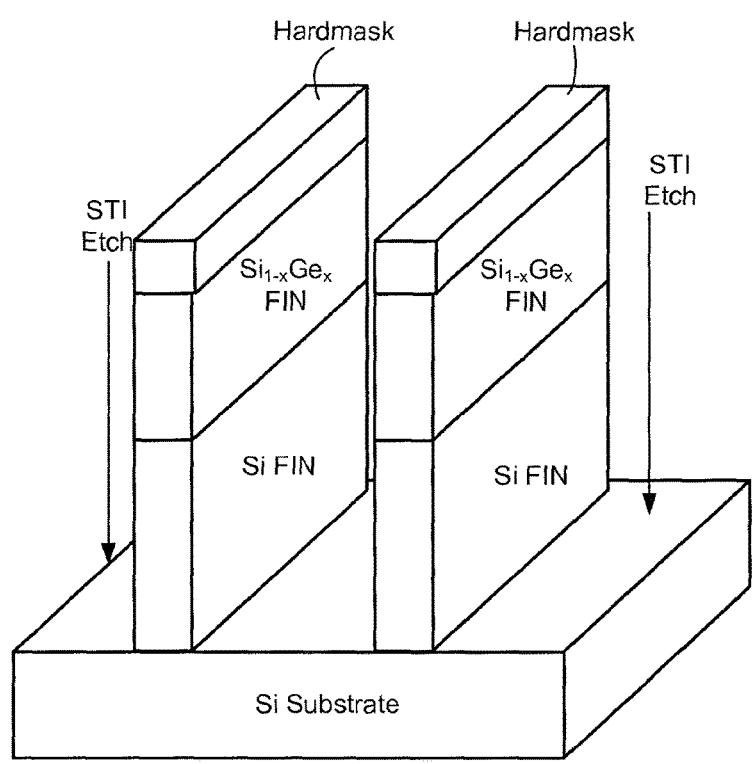
FIG. 2 shows a perspective view of uniaxially strained fin structures configured in accordance with an embodiment of the present invention.

As can be seen in FIG. 1a, a bulk substrate has a strain layer grown or otherwise deposited thereon. Any number of suitable bulk substrates and strain layer configurations can be used here, and particularly those upon which fins are formed prior to subsequent gate patterning and transistor formation processes. One specific example is shown in FIG. 2, which will be discussed in turn. As previously explained, such blanket strain layers are generally subjected to biaxial strain. Suitable material systems may include Si—Ge and III-V material systems, as will be apparent in light of this disclosure, although the claimed invention is not intended to be limited to any particular set of material systems.

FIG. 1b illustrates deposition and patterning of a hardmask on the strain layer of FIG. 1a, in accordance with one embodiment of the present invention. This can be carried out using standard photolithography, including deposition of hardmask materials (e.g., such as silicon dioxide, silicon nitride, and/or other suitable hardmask materials), patterning resist on a portion of the hardmask that will remain temporarily to protect an underlying region of the device (such as a diffusion or active area of a transistor device), etching to remove the unmasked (no resist) portions of the hardmask (e.g., using a dry etch, or other suitable hardmask removal process), and then stripping the patterned resist, thereby leaving the patterned hardmask as shown.

In one particular example embodiment, the width of the mask (which is designated as w in FIG. 1b and effectively defines the width of the fins to be formed thereunder) is in the range of 5 nm to 100 nm (such as 10 nm to 35 nm). In a more general sense, the width of the patterned mask will depend on factors such as the device being made, fab capability, and desired uniaxial strain, so any suitable mask width can be used. Recall that if the fins are too wide, the biaxial strain will tend not to convert to uniaxial, thereby giving rise to islands/defects.

In one example embodiment, the hardmask can be a standard two-layer hardmask configured with a bottom layer of oxide and top layer of silicon nitride. Single layer hardmasks (e.g., silicon nitride) can be used as well. In the example shown, the patterned hardmask includes three locations, but in other embodiments, the hardmask may be configured differently, depending on the particular active device. In one specific example embodiment having a Si substrate, the hardmask can be implemented with a two-layer mask having a bottom oxide and top layer of silicon nitride. Any number of hardmask configurations can be used, as will be apparent.

As can be seen in FIG. 1c, shallow trenches are etched into the strain layer and substrate to form the fins (three are shown, but any number of fins can be formed). The shallow trench etch can be accomplished with standard photolithography include wet or dry etching, or a combination of etches if so desired. The geometry of the trenches (width, depth, shape, etc) can vary from one embodiment to the next as will be appreciated, and the claimed invention is not intended to be limited to any particular trench geometry. In one specific example embodiment having a Si substrate and a two-layer hardmask implemented with a bottom oxide layer and a top silicon nitride layer, a dry etch is used to form the trenches that are about 50 Å to 5000 Å below the top surface of the substrate. Any number of trench configurations can be used, as will be apparent.

The resulting structure can include any number of fins (one or more). This example fin structure depicted in FIGS. 1a-c is fabricated using photolithography as typically done. In other embodiments, note that the fins can be epitaxially grown as is sometimes done, such as described in U.S. Patent Application Publication No. 2008/0157130, titled, "Epitaxial Fabrication of Fins for FinFET Devices." In such cases, the fin is effectively formed as a layer in the manufacturing process. By forming a fin layer, fin thickness is determined through control of the process parameters used to form the fin layer rather than photolithographic processes. For instance, if the fin is grown with an epitaxial process, the thickness of the fin will be determined by the growth dynamics of the epitaxy. FinFETs whose fin widths are determined through layer formation rather than photolithography may offer improved minimum features sizes and packing densities. Resulting fin geometries will generally vary depending on formation techniques employed.

FIG. 2 shows a perspective view of uniaxially strained fin structures configured in accordance with an embodiment of the present invention. In this specific example embodiment, the substrate is a Si bulk substrate and the strain layer is a layer of $Si_{1-x}Ge_x$ grown to a desired thickness, but at or below the critical thickness. The value of x can be, for example, in the range of 0.1 to 0.5. In one such case, the value of x is 0.3, such that the strain layer is a layer of $Si_{70}Ge_{30}$.

For tri-gate FinFETs, the hardmask can be removed (e.g., using a dry etch, or other suitable hardmask removal process) after forming the fins, in preparation of oxidizing the fins to condense the strain layer fin portions on both sides and the top of the fins. Alternatively, for double-gate FinFETs, the hardmask can be left in place to protect the fin tops from the oxidation process (so oxidation-based condensation only occurs from the opposing sides of the fin structures). As explained with respect to FIG. 1c, the depth of shallow trench isolation (STI) etch can vary, depending on desired performance. In general, taller fins provide a wider channel along the fin side (and therefore conduct more current, which may be desirable depending on the application). In some embodiments, the fin height (including both the substrate and strain layer portions) may be, for example, in the range of 50 nm to 5000 nm, while the strain layer portion alone may be, for example, in the range of 20 nm to 500 nm (e.g., 25 nm to 75 nm, or 125 nm to 150 nm).

Multi-Sided Fin Condensation

Figure 3A:
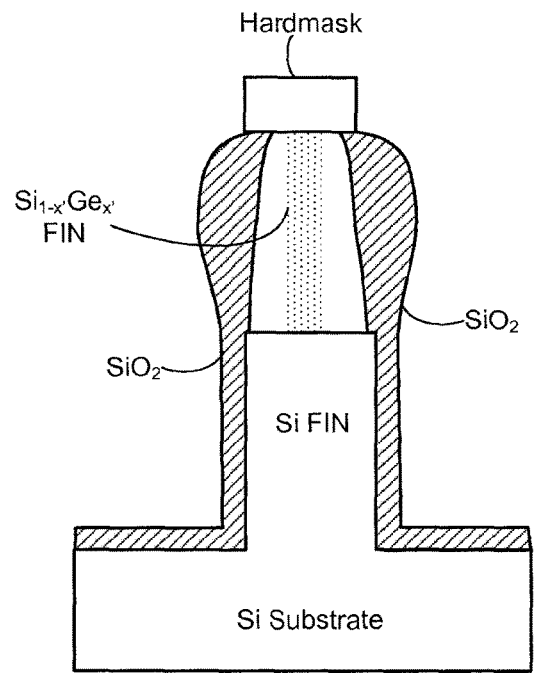
FIGS. 3a and 3b illustrate the process for multi-dimensional Ge condensation of an SiGe channel, in accordance with an embodiment of the present invention.
Figure 3B:
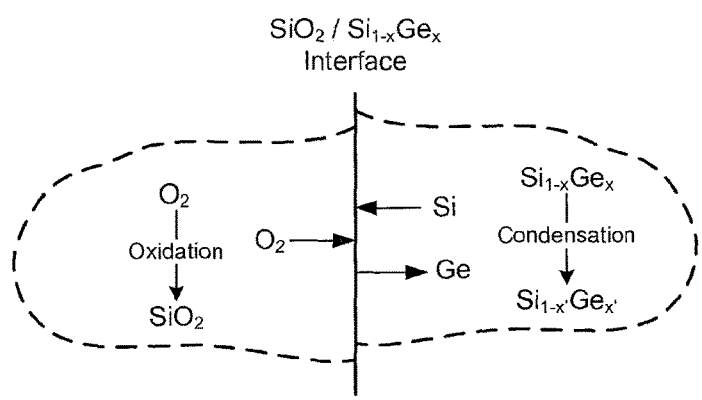

FIGS. 3a and 3b illustrate the process for multi-dimensional Ge condensation of an SiGe channel, in accordance with an embodiment of the present invention.

As can be seen in this example, the initial fin structure (pre-condensation) is configured as shown in FIG. 2, including a Si bulk substrate and a strain layer of $Si_{1-x}Ge_x$ grown to a desired thickness, but at or below the critical thickness. Assume for purposes of discussion that the value of x is 0.3, such that the strain layer is a layer of $Si_{70}Ge_{30}$. Other pre-condensation values of x can be used, as will be apparent in light of this disclosure. In general, higher Ge content can be used to enhance hole mobility of the PMOS transistors. However, higher content Ge leads to lower critical thickness. In this sense, there is an unresolved conflict associated with achieving both enhanced hole mobility of PMOS transistors and higher critical thickness of the strain layer.

Figure 5A:
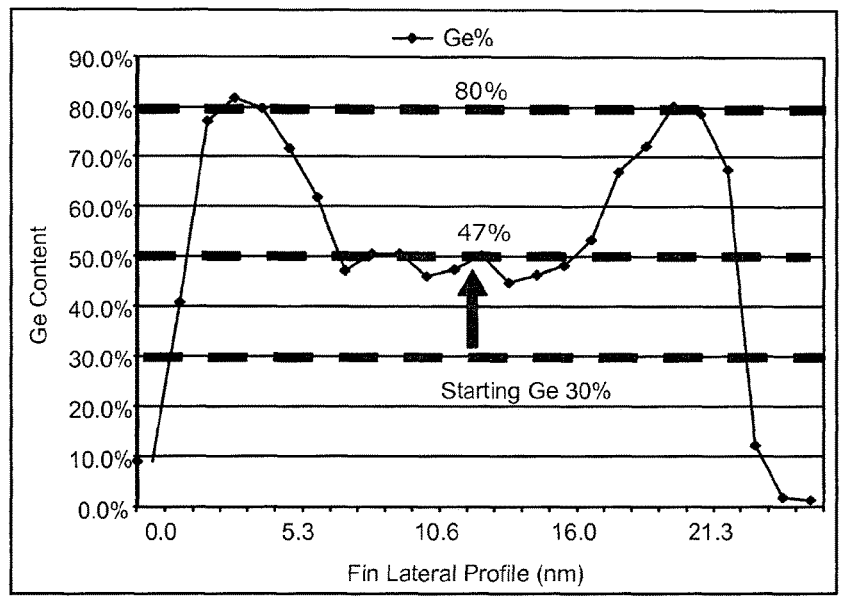
FIG. 5a illustrates the lateral profile of a fin structure with respect to its Ge content after condensation, in accordance with an embodiment of the present invention.

Thus, and in accordance with an embodiment of the present invention, condensation through oxidation is used to increase the Ge content of the fin. In general, a starting core fin of 30% Ge effectively gets various levels of condensation depending on how long the condensation occurs and how wide the fin is. For instance, the inner portion of the fin (shaded in FIG. 3a) can continue to rise as the left and right Ge diffusion fronts begin to merge (e.g., to 47% as best shown in FIG. 5a), while the sidewall surfaces have a higher value (e.g., 80% as best shown in FIG. 5a). Eventually under enough condensation the two condensation fronts could diffuse and merge resulting in a uniform single concentration (such as the 80%), and even reach the level of pure Ge.

The post-condensation concentration of Ge in the SiGe strain layer is in excess of the critical layer, and a highly uniaxially strained (compressive) SiGe channel is created. The resulting condensed strain layer is generally designated as $Si_{1-x'}Ge_{x'}$ in FIGS. 3a and 3b, to reflect the increase in Ge concentration, but may not be uniform through the entire fin profile as explained herein. For example, and continuing with the specific example case where the pre-condensation value of x is 0.3, the post-condensation value of x (i.e., x') can be, for instance, 0.8 at the sidewall surfaces of the fin (e.g., $Si_{20}Ge_{80}$) and 0.47 at the inner portion of the fin (e.g., $Si_{53}Ge_{47}$). Other post-condensation values of x can be used, depending on factors such as desired hole mobility.

In any case, and with reference to one example embodiment, as the fin structure is exposed to $O_2$ to cause oxidation, silicon dioxide ($SiO_2$) forms at the outer fin surface, as shown by the cross-hatched portion in FIG. 3a. As this oxidation process continues, the $SiO_2$ continues to consume Si from the SiGe portion of the fin, and Ge diffuses back into the fin (condensation). This oxidation and condensation process is symbolically represented as $SiGe+O_2 \rightarrow SiO_2+Ge$, and is represented schematically in FIG. 3b to show the process at the $SiO_2/Si_{1-x}Ge_X$ interface.

Figure 4:
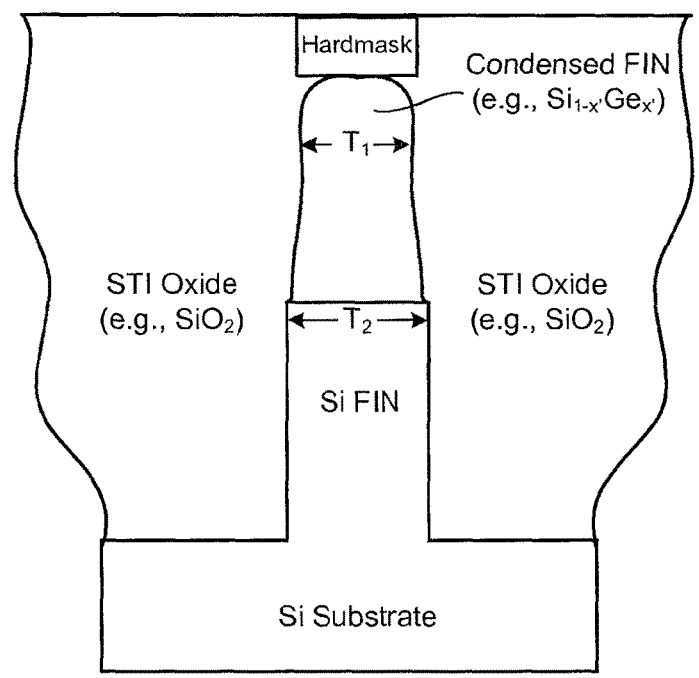
FIG. 4 illustrates a condensed fin after deposition and planarization of shallow trench isolation oxide, in accordance with an embodiment of the present invention.

After the oxidation-condensation process is completed, the hardmask can be removed if not already done (e.g., using a dry etch, or other suitable hardmask removal process), in preparation for subsequent processing such as deposition of STI oxide, planarization, gate patterning, and device formation. Note, however, that the hardmask may also be left in place (e.g., STI oxide can be deposited over it). In one such embodiment, the hardmask is effectively used as a polish stop, when polishing STI dielectric. FIG. 4 illustrates a condensed fin after deposition and planarization of shallow trench isolation oxide, in accordance with an embodiment of the present invention. In this example case, the STI oxide is implemented with $SiO_2$. Numerous other suitable dielectric materials can be used here, as will be appreciated, depending on factors such as the desired electrical isolation or k-factor, and the desired compressive or tensile strain induced by the STI dielectric material, if any). Continuing with the specific example case where the post-condensation strain layer is $Si_{20}Ge_{80}$, and in accordance with one such embodiment, the thickness at location $T_1$ of the fin is in the range of 5 nm to 20 nm (e.g., 16 nm to 17 nm), and the thickness at location $T_2$ of the fin is in the range of 25 nm to 35 nm (e.g., 30 nm to 32 nm). The length of the strain layer portion of the fin can be, for example, in the range of 5 nm to 200 nm (e.g., 60 nm), from Si fin portion to top of SiGe fin portion.

Thus, in accordance with one example embodiment of the present invention, a process for multi-dimensional Ge condensation of a SiGe fin-based channel PMOS device having high hole mobility is provided. Note that the originally deposited fins had a 30% Ge concentration below the critical thickness. The final concentration of the fins, after oxidation-based condensation, has a Ge concentration of 80% or more, without defects that would normally be present for a biaxially strained planar film with Ge content in excess of the critical thickness (i.e., critical thickness is normally constrained by the concentration of Ge, but the condensation techniques provided herein effectively overcome this constraint). Thus, the post-concentration of Ge in this example is more than 2.5 times greater than the pre-condensation concentration of Ge. In addition, the uniaxial compressive strain of the channel is provided with increasing Ge concentration. The process can be used in forming, for example, any type of FinFET transistor architecture (e.g., double-gate, trigate, surround gate, etc).

As previously explained, SiGe based FinFETs have been made on SOI-based substrates (e.g., GeOI or SiGeOI, or generally XOI), but unlike the Ge on a bulk Si substrate which will continue to diffuse down into the substrate, the Ge in the XOI-based substrate will effectively pile up at the buried oxide interface. For a strained layer SiGe condensing on top of a crystalline bulk Si substrate, the resulting SiGe lattice will be strained relative to the lattice of the Si substrate (or, in the case that only a portion of the SiGe layer is exposed to condensation, then the strain is relative to the SiGe layer below the exposed fin being condensed). In contrast, with an XOI-based substrate, this condensed SiGe fin would be bonded to the amorphous buried oxide layer beneath it (as opposed to the crystalline Si or SiGe substrate). Since the buried oxide of the SOI substrate can yield, there is a relaxation of the stress. This subtle distinction is significant, as the uniaxial stress in the fins is not sufficiently maintained for the XOI case.

As will be appreciated in light of this disclosure, Ge condensation effectively results from the diffusion of $O_2$ into the SiGe strain layer, followed by oxidation into $SiO_2$ and the release of Ge which then diffuses down into the substrate. This process is limited by the supply of oxygen diffusing through the resulting $SiO_2$ layer, the reaction rate to form $SiO_2$ as well as the diffusivity of Ge out of the resulting $SiO_2$ layer and through the condensed strain SiGe layer below. In the case of SiGeOI substrate, the Ge will be blocked from diffusing further than the buried oxide layer, whereas in the case of SiGe on bulk Si, the Ge continues to diffuse into the substrate Si.

Self-Forming Cladding Layer Via Condensation

Figure 5B:
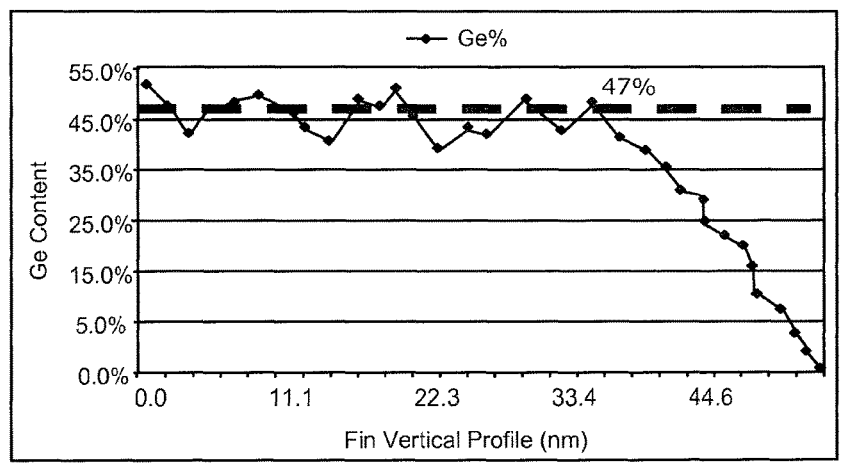
FIG. 5b illustrates the vertical profile of a fin structure with respect to its Ge content after condensation, in accordance with an embodiment of the present invention.

FIGS. 5a and 5b illustrate the lateral and vertical profiles, respectively, of a fin structure with respect to its Ge content after condensation, in accordance with an embodiment of the present invention.

As can be seen in FIG. 5a, the multi-dimensional condensation process allows the Ge concentration along the sidewalls of the strain layer portion of the fin to be higher with respect to the Ge concentration in the middle of that strain layer portion of the fin. Such a configuration effectively operates as a self-formed cladding layer. In the example shown, the initial Ge concentration was about 30%. As will be appreciated, the concentration percentages used herein refer to atomic fractions.

After two-dimensional condensation from both fin sides, the post-condensation Ge concentration along the fin sidewalls is about 80%, and about 47% in the middle of that strain layer portion of the fin. The fin of this example is about 22 nm wide, with the higher concentrations occurring within about 6 nm of the sidewalls and the lower concentration in the middle section which is about 15 nm. Out-diffusion of the Ge down and into the silicon fin portion (toward the substrate) along the sidewalls further allows for the self-forming cladding profile.

In more detail, and as can be seen in FIG. 5b, the multi-dimensional condensation process further allows the Ge concentration along the vertical profile of the strain layer portion of the fin to remain relatively constant. In the example shown, for instance, the Ge concentration through the center of the fin remains at about 47% for about 30 nm of vertical fin length (from the top of the strain layer portion of the fin toward the bottom of that portion). Note that this is a consequence of leaving the hardmask layer on top of the fin to block or otherwise inhibit oxidation/condensation. If the hardmask had been removed, then a similar peaking to higher Ge concentration levels (e.g., to 80% or higher) at the fin center could more readily occur. After that, the concentration begins to drop off to 0% in about another 22 nm of vertical fin length. Further note the Ge concentrations at the fin sidewalls also remain relatively constant down the vertical fin length (e.g., from 30 nm to 70 nm). In the example embodiment shown, this concentration is at about 80% down to about 60 nm from the top of the fin.

Figure 6A:
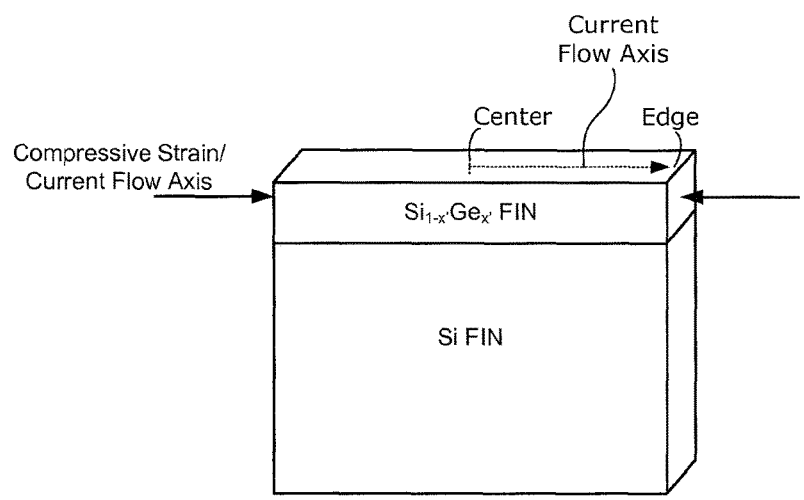
FIGS. 6a and 6b illustrate a relatively high level of uniaxial strain in a condensed portion of a fin structure, in accordance with an embodiment of the present invention.
Figure 6B:
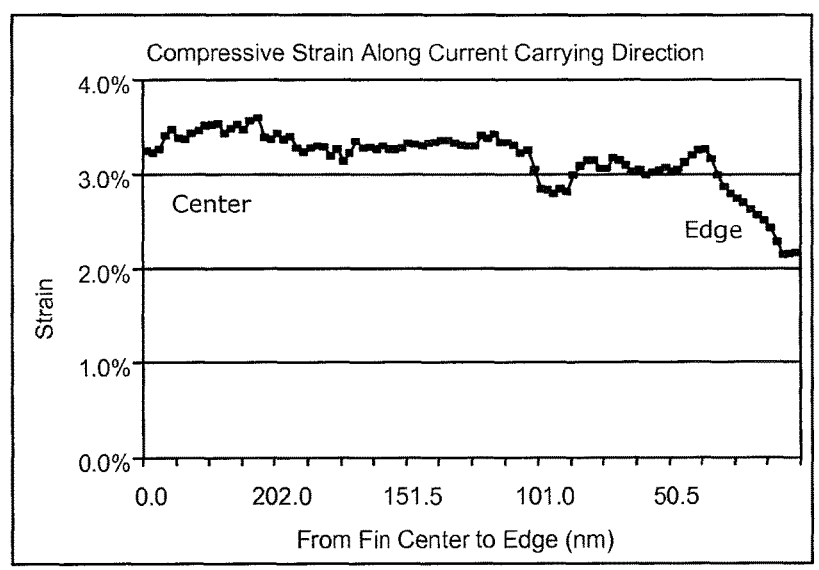

FIGS. 6a and 6b illustrate a relatively high level of uniaxial strain in a condensed portion of a fin structure, in accordance with an embodiment of the present invention. As can be seen in FIG. 6a, the uniaxial compressive strain generally runs from the center of the fin to the edge (lengthwise across the fin), across the strain layer SiGe portion in the current flow axis. As the fin is lattice matched to the underlying silicon it results in compressively strained SiGe in the direction of current flow and this enhances hole mobility. FIG. 6b shows this uniaxial strain to be about 3% or greater relative to the silicon lattice below which is indicative of the high Ge concentration in the SiGe fin.

Methodology

Figure 7:
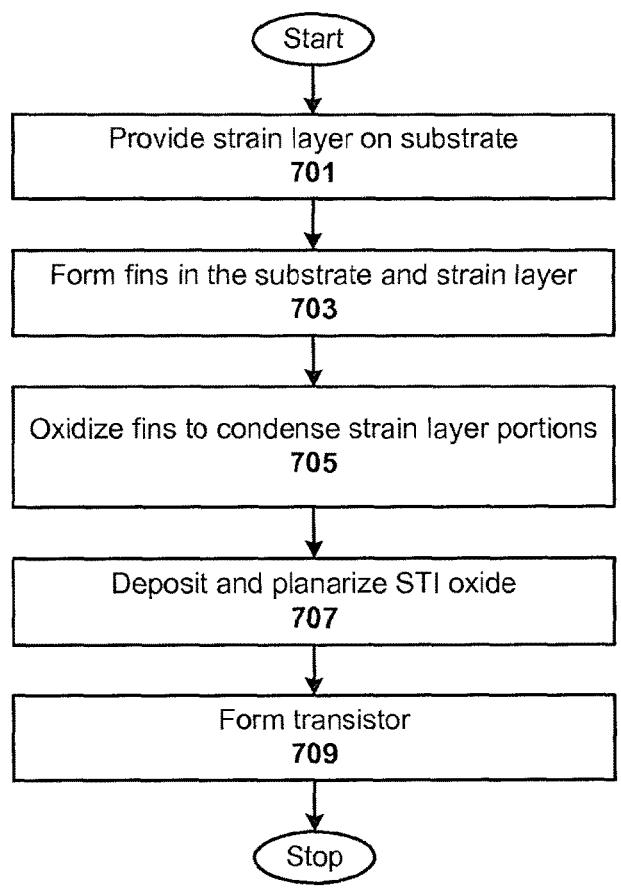
FIG. 7 illustrates a method for fabricating a FinFET transistor, in accordance with an embodiment of the present invention.

FIG. 7 illustrates a method for fabricating a FinFET transistor, in accordance with an embodiment of the present invention. The method can be used to form, for example, double-gate and/or tri-gate transistor structures. In a more general sense, the method can be used to form any semiconductor device that employs densification of a fin-based strain layer.

The method includes providing 701 a strain layer on a bulk substrate. As previously explained, the strain layer can be epitaxially grown or otherwise deposited on the substrate to a desired thickness, but at or below the critical thickness. This blanket strain layer is generally subjected to biaxial strain.

The method continues with forming 703 fins in the substrate and strain layer. In one example case, this generally includes patterning the strain layer into one or more fins, so as to convert the biaxial strain to uniaxial strain. This patterning can be achieved using photolithography. Alternatively, the fins can be formed via epitaxial growth, as previously explained.

The method continues with oxidizing 705 the fins to condense the strain layer portions of the fins. For instance, in one specific example case, a strain layer of SiGe is deposited on a Si substrate. In such a case, the addition of oxygen ($O_2$) or ozone ($O_3$) consumes a percentage of Si from the SiGe strain layer to form $SiO_2$, thereby effectively pushing Ge from the SiGe strain layer into the fin (hence, a condensing of Ge). Other oxidation-condensing schemes will be apparent in light of this disclosure. As previously explained, this condensation may occur from both sides of the fin and the top of the fin, simultaneously (e.g., tri-gate transistor devices). In other embodiments, the condensation may be tailored such that, for instance, only the fin sides are oxidized and the top is protected from oxidation via a hardmask (e.g., double-gate transistor devices).

The method continues with depositing and planarizing 707 STI oxide over the condensed fin structure, and forming 709 the transistor structure (e.g., gate, source, and drain regions; contacts, etc). As previously explained, any number of suitable transistor types and configurations can be implemented here (e.g., PMOS, NMOS, double-gate, tri-gate, surround gate, etc). Any such transistor structure that can benefit from the oxidation-based condensation as described herein can be used, so as to provide that device with relatively high uniaxial strain in the strain layer portions of the fin structures and/or a two-dimensional distribution of condensed material within the fin structures (e.g., a cladding layer of condensed material) as previously described.

Numerous embodiments and configurations will be apparent in light of this disclosure. For instance, one example embodiment of the present invention provides a method for fabricating fin-based transistors. The method includes providing a strain layer on a bulk substrate, the strain layer being associated with a critical thickness that is dependent on a component of the strain layer, the strain layer having a thickness lower than or equal to the critical thickness. The method further includes forming a fin in the substrate and strain layer, such that the fin includes a substrate portion and a strain layer portion. The method further includes oxidizing the fin to condense the strain layer portion of the fin, so that a concentration of the component in the strain layer changes from a pre-condensation concentration to a higher post-condensation concentration, thereby causing the critical thickness to be exceeded. Note that the thickness (or vertical height) of the strain layer is not necessarily changing as a result of oxidation; rather, the concentration of the component in the strain layer is changing (e.g., the vertical height of the strain layer may remain constant from pre-condensation to post-condensation). In one particular case, after oxidizing the fin, the method may further include at least one of depositing and planarizing shallow trench isolation (STI) oxide over the fin, and forming at least one of gate, drain region, and source transistor regions. In another particular case, the fin has a uniaxial strain in a current flow axis. In another particular case, oxidizing the fin to condense the strain layer portion causes a two-dimensional distribution of the component within the fin. In another particular case, oxidizing the fin causes multi-sided condensation of the fin. In another particular case, there may be a plurality of fins. In another particular case, the bulk substrate is silicon and the strain layer is silicon germanium, the component being germanium, and the post-concentration of germanium is at least 2 times greater than the pre-condensation concentration of germanium. In another particular case, the post-concentration of the component is at least 2 times greater than the pre-condensation concentration of the component.

Another example embodiment of the present invention provides a fin-based transistor device. The device includes a strain layer provided on a bulk substrate, the strain layer being associated with a critical thickness that is dependent on a component of the strain layer. The device further includes a fin formed in the substrate and strain layer, such that the fin includes a substrate portion and a strain layer portion. The fin is oxidized to condense the strain layer portion of the fin, so that a concentration of the component in the strain layer changes from a pre-condensation concentration to a higher post-condensation concentration, thereby causing the critical thickness to be exceeded. As previously explained, note that the thickness (or vertical height) of the strain layer is not necessarily changing as a result of oxidation; rather, the concentration of the component in the strain layer is changing (e.g., the vertical height of the strain layer may remain constant from pre-condensation to post-condensation). In one particular case, the device may further include at least one of gate, drain region, and source transistor regions. In another particular case, the fin has a uniaxial strain in a current flow axis. In another particular case, the device comprises at least one PMOS FinFET tri-gate and/or double gate transistor. In another particular case, the oxidized fin has a two-dimensional distribution of the component in the strain layer portion. In another particular case, the post-concentration of the component is at least 2 times greater than the pre-condensation concentration of the component. In some cases, the strain layer may have a pre-condensation thickness that is lower than or equal to the critical thickness.

Another example embodiment of the present invention provides a method for fabricating fin-based transistors. This example method includes providing a strain layer on a bulk substrate, the strain layer being associated with a critical thickness that is dependent on a component of the strain layer, the strain layer having a thickness lower than or equal to the critical thickness. The method further includes forming a plurality of fins in the substrate and strain layer, such that each fin includes a substrate portion and a strain layer portion. The method further includes oxidizing the fins to condense the strain layer portion of each fin, so that a concentration of the component in the strain layer changes from a pre-condensation concentration to a higher post-condensation concentration, thereby causing the critical thickness to be exceeded. Oxidizing the fins further causes a two-dimensional distribution of the component within the fin. As previously explained, it is the increase in the concentration of the component in the strain layer that causes the critical thickness to be exceeded, and not necessarily an increase in strain layer thickness. In one particular case, after oxidizing the fins, the method may further include at least one of depositing and planarizing shallow trench isolation (STI) oxide over the fins, and forming at least one of gate, drain region, and source transistor regions. In another particular case, each of the fins has a uniaxial strain in a current flow axis. In another particular case, oxidizing the fins to condense the strain layer portion causes a two-dimensional distribution of the component within each of the fins. In another particular case, the bulk substrate is silicon and the strain layer is silicon germanium, the component being germanium, and the post-concentration of germanium is at least 2 times greater than the pre-condensation concentration of germanium. In another particular case, the post-concentration of the component is at least 2 times greater than the pre-condensation concentration of the component.

Another example embodiment of the present invention provides a fin-based transistor device. The device includes a silicon germanium strain layer provided on a silicon bulk substrate. The device further includes a fin formed in the substrate and strain layer, such that the fin includes a substrate portion and a strain layer portion, the strain layer portion of the fin having a concentration of germanium of 75% or higher, a concentration of silicon of 25% or lower, and a lateral thickness of 20 nm or less across the strain layer portion at one or more locations. The device may further include at least one of gate, drain region, and source transistor regions. In one particular case, the fin has a uniaxial strain in a current flow axis. In another particular case, the fin has a two-dimensional distribution of the component in the strain layer portion. In another particular case, the strain layer is associated with a critical thickness that is dependent on a component of the strain layer, the component being germanium, and the strain layer portion of the fin has a vertical height that exceeds that critical thickness. As will be appreciated in light of this disclosure, the vertical height of the strain layer portion may remain constant during the fabrication processes (e.g., from pre-condensation to post-condensation processing).

The foregoing description of example embodiments of the invention has been presented for the purposes of illustration and description. It is not intended to be exhaustive or to limit the invention to the precise forms disclosed. Many modifications and variations are possible in light of this disclosure. It is intended that the scope of the invention be limited not by this detailed description, but rather by the claims appended hereto.

What is claimed is:

1. A fin-based transistor device, comprising:
   a silicon germanium layer provided on a silicon bulk substrate; and
   a fin formed in the substrate and silicon germanium layer, such that the fin includes a silicon bulk substrate portion and a silicon germanium layer portion, the silicon germanium layer portion having an upper surface and sidewall surfaces around an inner portion, wherein the upper surface and sidewall surfaces comprise a higher concentration of germanium than the inner portion, the silicon germanium layer portion having a lateral thickness less than a lateral thickness of the silicon bulk substrate portion where the silicon germanium layer portion contacts the silicon bulk substrate portion.

2. The device of claim 1, further comprising:
   a gate;
   a drain region; and
   a source region.

3. The device of claim 1, wherein the fin has a uniaxial strain in a current flow axis.

4. The device of claim 1, wherein the silicon germanium layer portion has a vertical thickness greater than a vertical thickness of the silicon bulk substrate portion of the fin.

5. The device of claim 1, wherein the silicon germanium layer portion of the fin has a vertical height that exceeds a critical thickness, wherein the critical thickness is dependent on the germanium concentration of the silicon germanium layer.

6. A fin-based transistor device, comprising:
   a silicon bulk base substrate; and
   a fin having a lower silicon bulk substrate portion and an upper silicon germanium layer portion on the lower substrate portion, wherein the concentration of a component in the upper silicon germanium layer portion determines a critical thickness, wherein the critical thickness is exceeded by the thickness of the upper silicon germanium layer portion, the silicon germanium layer portion having an upper surface and sidewall surfaces around an inner portion, wherein the upper surface and sidewall surfaces comprise a higher concentration of germanium than the inner portion, the silicon germanium layer portion having a lateral thickness less than a lateral thickness of the silicon bulk substrate portion where the silicon germanium layer portion contacts the silicon bulk substrate portion.

7. The fin-based transistor device of claim 6, wherein the upper silicon germanium layer portion is stacked on top of the lower substrate portion.

8. The fin-based transistor device of claim 6, wherein the component is germanium.

9. The fin-based transistor device of claim 6, further comprising:
 a gate;
 a drain region; and
 a source region.

10. The fin-based transistor device of claim 6, wherein the upper silicon germanium layer portion has a uniaxial strain along a current flow axis.

11. The fin-based transistor device of claim 6, wherein the device comprises at least one PMOS FinFET, tri-gate, or double gate transistor.

12. The fin-based transistor device of claim 6, wherein the silicon germanium layer portion has a vertical thickness greater than a vertical thickness of the silicon bulk substrate portion of the fin.

\* \* \* \* \*